United States Patent [19]

Noguchi et al.

[11] Patent Number: 4,769,789
[45] Date of Patent: Sep. 6, 1988

[54] SEMICONDUCTOR MEMORY DEVICE HAVING SERIAL DATA INPUT AND OUTPUT CIRCUIT

[75] Inventors: Masaaki Noguchi, Seto; Junji Ogawa; Yoshihiro Takemae, both of Tokyo, all of Japan

[73] Assignee: Fujitsu Limited, Kawasaki, Japan

[21] Appl. No.: 814,388

[22] Filed: Dec. 30, 1985

[30] Foreign Application Priority Data

Jan. 5, 1985 [JP] Japan ................ 60-000313

[51] Int. Cl.$^4$ .............................................. G11C 7/00
[52] U.S. Cl. .................................... 365/189; 365/219
[58] Field of Search ................. 365/189, 73, 230, 219, 365/221

[56] References Cited

U.S. PATENT DOCUMENTS 4,222,102  9/1980  Jansen et al. ...................... 365/73 X
4,498,155  2/1985  Mohan Rao ........................ 365/189
4,586,167  4/1986  Fujishima et al. .................. 365/189

FOREIGN PATENT DOCUMENTS 57-27477  2/1982  Japan .

Primary Examiner—Stuart N. Hecker
Assistant Examiner—Alyssa H. Bowler

Attorney, Agent, or Firm—Staas & Halsey

[57] ABSTRACT

A dual-port type semiconductor memory device having a serial data input and output circuit (200) provided outside of a memory cell array (1) and operable for high-speed serial data input and output of data in addition to random data access. The semiconductor memory device includes a single decoding circuit (5) triggering at least one gate for transferring data to be stored into or read from the memory cell array in a random data access mode and setting a single bit into a corresponding shift register (24) in the serial data input and output circuit in a serial data input and output operation mode. Preferably, the decoding circuit is operated only during a time for operatively connecting bit lines and latch circuits in the serial data input and output circuit in the serial data input and output operation mode. The serial data input and output circuit is operable independently from the memory cell array, except during the time for operatively connecting the bit lines and the latch circuits through transfer gates, for serially inputting data to or outputting data from the latch circuits through serial data bus by sequentially triggering the serial gates from a certain gate designated by the corresponding shift register in response to the decoding circuit.

19 Claims, 21 Drawing Sheets

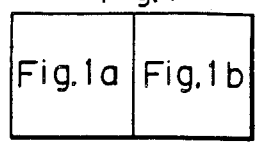
Fig. 1a PRIOR ART
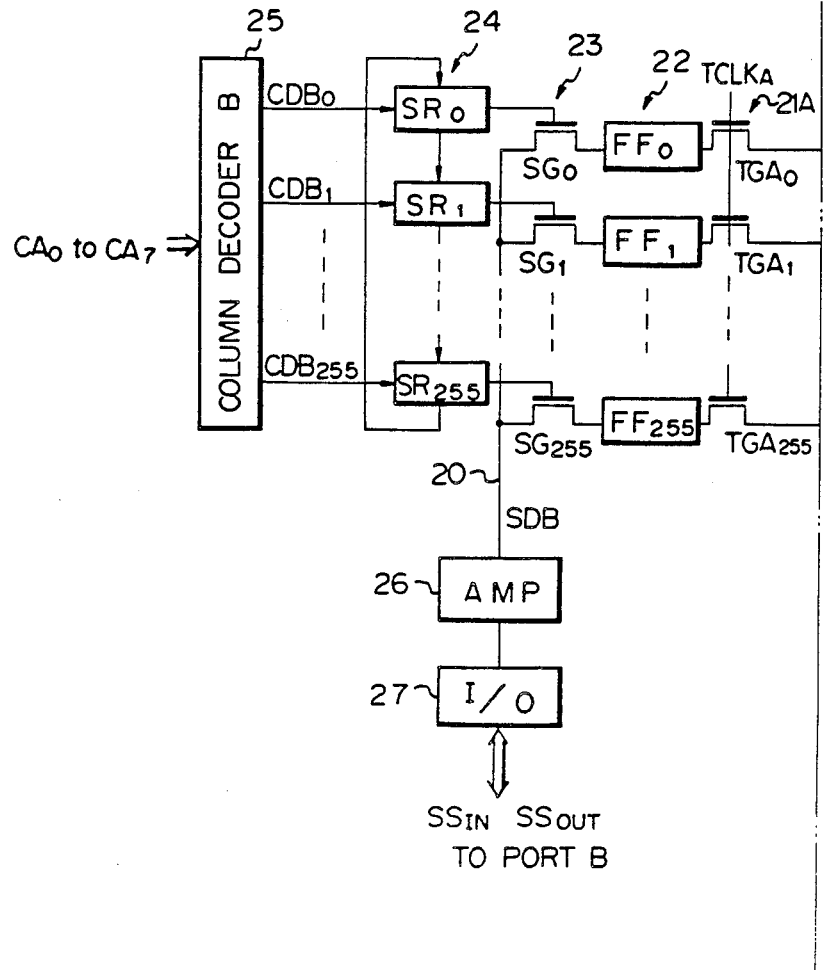

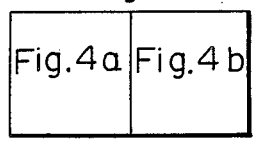
*Fig. 4a*
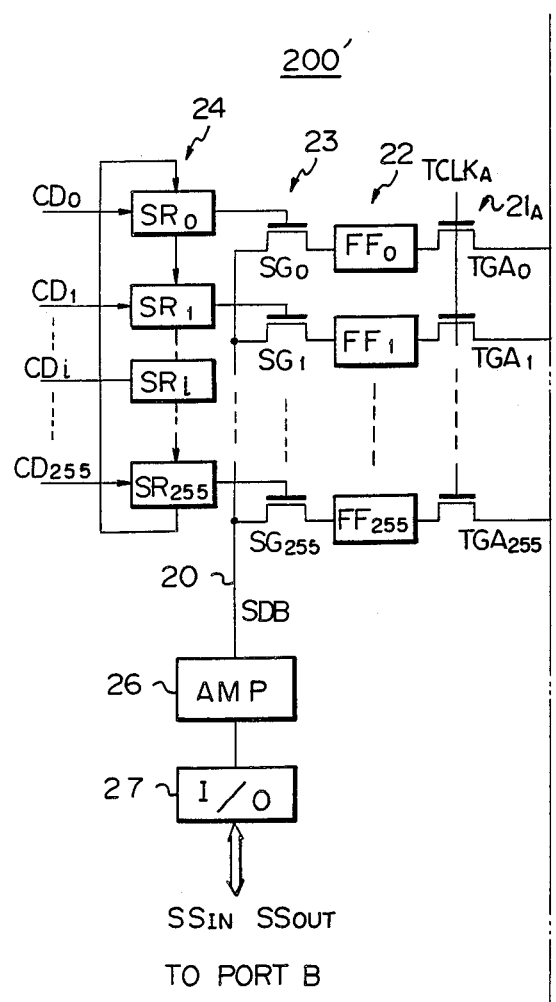

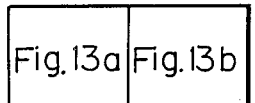
Fig. 13a
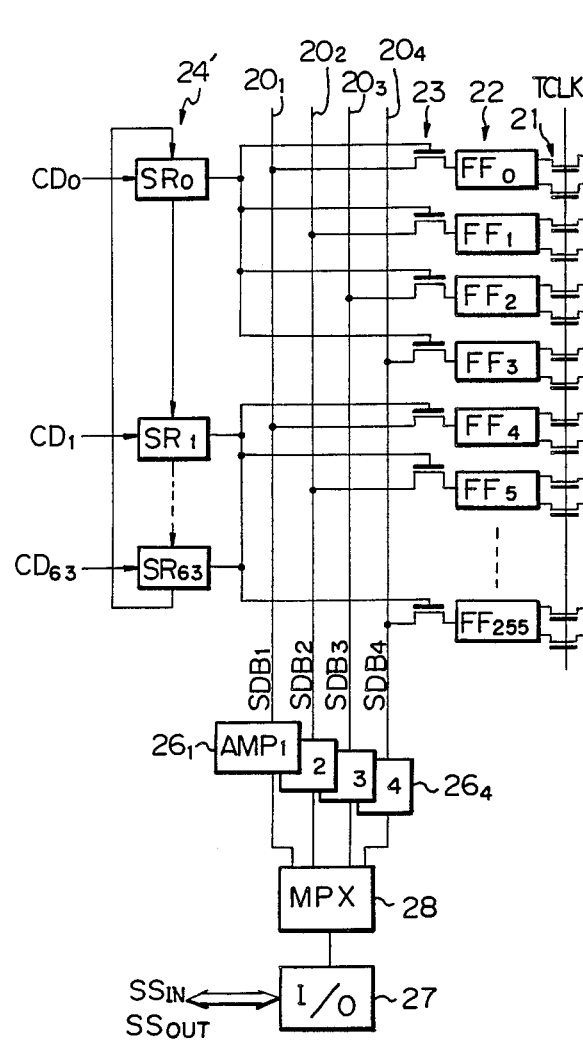

SEMICONDUCTOR MEMORY DEVICE HAVING SERIAL DATA INPUT AND OUTPUT CIRCUIT

BACKGROUND OF THE INVENTION

1. Field of the Invention

The present invention relates to a semiconductor memory device. More particularly, it relates to a semiconductor memory device having a high-speed serial data input and output circuit in addition to a random data input and output circuit.

2. Description of the Related Art

An image data processing system or the like requires a large-capacity memory. To meet the requirement for a large-capacity memory at low cost, a dynamic random-access memory (RAM) is extensively used. In addition, in order to display a large amount of image data stored in the RAM on a cathode ray tube (CRT) display unit and perform image data processing for the large amount of image data, such as gradients and filtering, high-speed data store and/or read-out are also highly required. A normal semiconductor memory device having a dynamic RAM and operable for random access for each unit of data, per se, however, suffers from a disadvantage of low-speed data store and/or read-out for a large amount of image data.

Recently, in order to overcome the above disadvantage, there are known so-called dual-port memory devices, i.e., semiconductor memory devices including a high-speed data input and output circuit provided outside the dynamic RAM. A dual-port memory device is operable for not only normal random access through a conventional port, but also high-speed serial data input and output used by a high-speed data input and output circuit through another port.

These prior art semiconductor memory devices, however, still suffer from disadvantages of complex circuit configurations, use of a considerably large space on the semiconductor chip, which may lead to low integration, and high power consumption.

SUMMARY OF THE INVENTION

It is an object of the present invention to provide a semiconductor memory device having a serial data input and output circuit with low-cost, large-capacity memory cells; reduced complexity of the circuit configuration and use of space on a chip; and low power consumption.

According to the present invention, there is provided a semiconductor memory device including: at least one memory cell array including a plurality of memory cells arranged in matrix form with a plurality of bit lines and a plurality of word lines a circuit, operatively connected to the memory cell array, for selecting one of the word lines in response to an address signal, and a plurality of gates, operatively connected between the bit lines and at least one data bus, for transferring data to be stored or read between the bit lines and the data bus. The semiconductor memory device also includes a circuit for serial data input and output, including a plurality of transfer gates, operatively connected to the bit lines, and operable in a group in response to a transfer clock pulse, a plurality of latch circuits having terminals operatively connected to the transfer gates and holding data to be stored or read, a plurality of serial gates, having terminals operatively connected to other terminals of the latch circuits and having other terminals connected to at least one serial data bus, and a plurality of ring-connected shift registers triggering the serial gates, a single bit being shifted therethrough. The semiconductor memory device further includes a decoding circuit operatively connected to the gates and triggering at least one of the gates in response to another address signal in a random access operation mode and operatively connected to the shift registers and loading a single bit into a corresponding shift register in response to the column address signal in a serial data input and output operation mode. The serial data input and output circuit is operable independently from the memory cell array, except during a time for operatively connecting the bit lines and the latch circuits through the transfer gates, for serially inputting data into or outputting data from the latch circuits through the serial data bus by sequentially triggering the serial gates from a certain gate designated by the corresponding shift register in response to the decoding circuit.

Preferably, the decoding circuit is operated only during the time for operatively connecting the bit lines and the latch circuits in the serial data input and output operation mode.

BRIEF DESCRIPTION OF THE DRAWINGS

Other objects and features of the present invention will be described below in detail with reference to the accompanying drawings, in which.

DESCRIPTION OF THE PREFERRED EMBODIMENTS

Figure 2:
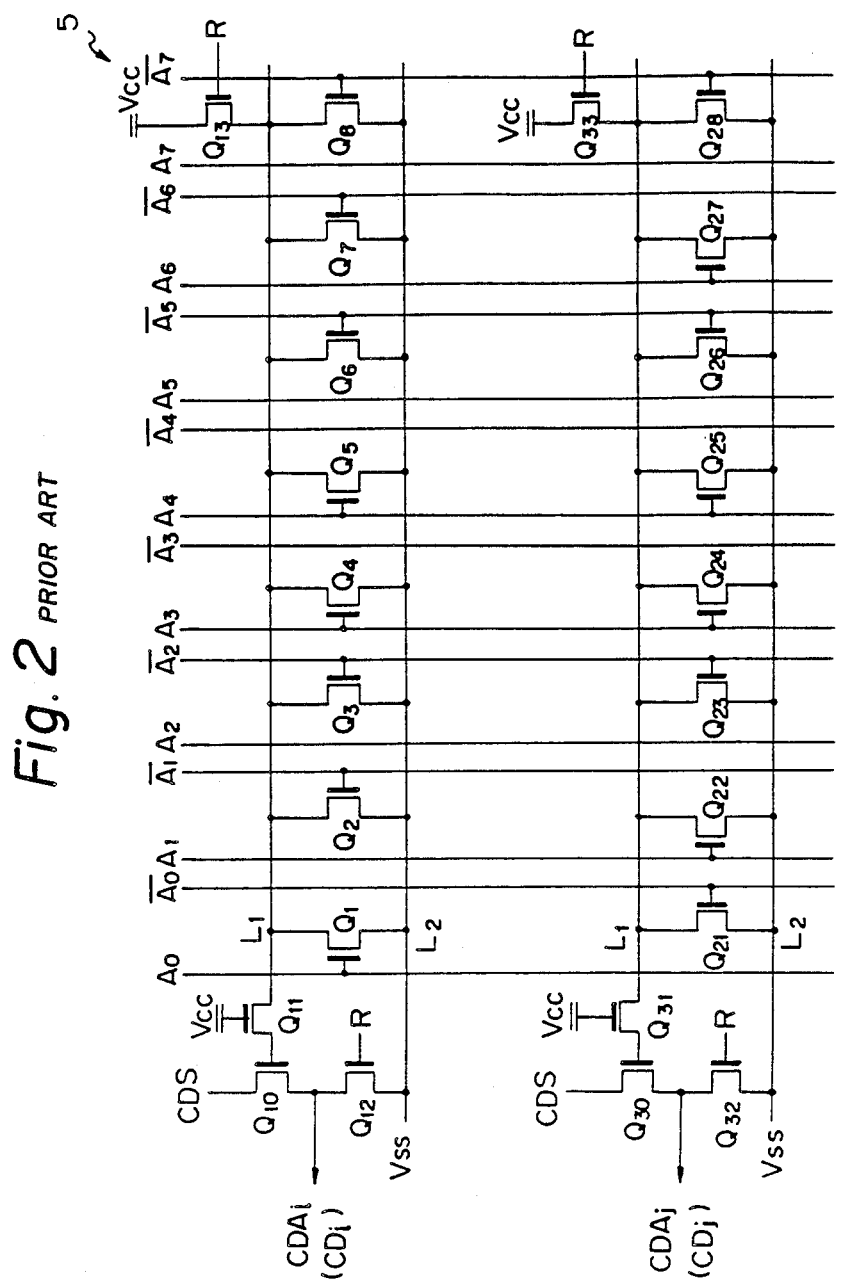
FIG. 2 is a circuit diagram of a part of a column decoder shown in FIG. 1.

Before describing preferred embodiments of the present invention, an explanation will be given of the prior art for reference.

Referring to FIG. 1, a prior art dual-port type dynamic RAM device includes a dynamic RAM portion 100 and a serial data input and output (I/O) portion 200. The dynamic RAM portion 100 includes a dynamic RAM cell array 1, a sense amplifier group 2, first and second gate groups 3 and 4, a column decoder 5, a row decoder 6, an amplifier circuit 7, an I/O circuit 8, and a pair of data buses (DB and $\overline{DB}$) $10_A$ and $10_B$. The dynamic RAM portion 100 is of an open-bit line type, wherein each pair of bit lines $BL_i$ and $\overline{BL}_i$ extends from both sides of the corresponding sense amplifier $SA_i$. The dynamic RAM cell array 1 includes 64K bit of memory cells (MC's) connected between bits lines $\overline{BL_0}$ to $\overline{BL_{255}}$ and $BL_0$ to $BL_{255}$ and word lines $WL_0$ to $WL_{127}$ and $\overline{W_0}$ to $\overline{WL_{127}}$. The row decoder 6 receives a row address signal of eight bits $RA_0$ to $RA_7$ and energizes a word line defined by the received row address signal. The column decoder 5 also receives a column address signal of eight bits $CA_0$ to $CA_7$ and outputs a column decoded signal CDA defined by the received column address signal to the first and second gate groups 3 and 4. The sense amplifier group 2 consists of 256 sense amplifiers $SA_0$ to $S_{255}$, each operatively connected to a pair of corresponding bit lines $BL_i$ and $\overline{BL}_i$. The first gate group 3 consists of 256 gates $GA_0$ to $GA_{255}$, each connected between the data bus $10_A$ and the corresponding bit line $BL_i$. The second gate group 4 also consists of 256 gates $GB_0$ to $GB_{255}$, each connected between another data bus $10_B$ and the corresponding bit line $\overline{BL}_i$.

In a random access mode for data read, the bit lines $BL_0$ to $BL_{255}$ and $\overline{BL_0}$ to $\overline{BL_{255}}$ are precharged. A pair of word lines $WL_i$ and $\overline{WL}_i$ and a pair of dummy word lines (not shown) are selected by the row decoder 6 in response to the row address signal of $RA_0$ to $RA_7$, connecting a plurality of memory cells MC between the selected word lines $WL_i$ and $\overline{WL}_i$ and the bit lines $BL_0$ and $BL_{255}$ and $\overline{BL_0}$ to $\overline{BL_{255}}$. As a result, the voltage difference based on the content stored in each memory cell, i.e., "1" or "0", appears on each bit line. The sense amplifiers $SA_0$ to $SA_{255}$ are switched to an active state and amplify the voltage differences on the bit lines. One of each pair of bit lines becomes a high level, e.g., approximately the power source voltage level $V_{CC}$, and the other becomes a low level, for example, the ground level $V_{SS}$. After that, the column decoder 5 is operated and outputs a column decoded signal $CD_i$ to gates of a pair of gates $GA_i$, and $GB_i$, in response to the received column address signal $CA_0$ to $CA_7$, resulting in the connection of the corresponding bit lines $BL_i$ and $\overline{BL}_i$ to the data buses $10_A$ and $10_B$ through the corresponding gates $GA_i$ and $GB_i$, respectively. Stored data in the selected memory cell is detected at the amplifier circuit 7 and is output to a port (not shown) through the I/O circuit 8. In a random access mode for data store, data to be stored is supplied to the port and is stored in the corresponding memory cell through the I/O circuit 8 and the amplifier circuit 7.

The serial I/O portion 200 is provided outside of the dynamic RAM portion 100. The sterial I/O portion 200 includes a transfer gate group 21A, a latch circuit group 22, a serial gate group 23, a shift register group 24, another column decoder 25, an amplifier circuit 26 and an I/O circuit 27. The transfer gate group 21A consists of 256 gates $TGA_0$ to $TGA_{255}$ connected to the bit lines $BL_0$ to $BL_{255}$. The latch circuit group 22 consists of 256 flip-flops $FF_0$ to $FF_{255}$, each having a set input terminal connected to the corresponding transfer gate $TGA_i$. The serial gate group 23 consists of 256 gates $SG_0$ to $SG_{255}$, each having a terminal connected to an output terminal of the corresponding flip-flop $FF_i$ and another terminal connected to a serial data bus (SDB) 20. The shift register group 24 consists of 256 shift registers $SR_0$ to $SR_{255}$ connected in cascade to form a ring counter.

In a serial access mode for data read, the bit lines are precharged and the pair of word lines and the dummy word lines are selected, whereby a plurality of data in the memory cells selected by the word lines are sensed at the sense amplifiers, set forth above. As a transfer clock signal $TCLK_A$ is supplied to the transfer gate group 21A, 256 gates $TGA_0$ to $TGA_{255}$, which are formed by metal-oxide semiconductor field-effect transistors (MOS FET's), are turned ON during a time for the application of a transfer clock signal $TCLK_A$, transferring 256 data bits on the bit lines $BL_0$ to $BL_{255}$ to the flip-flops $FF_0$ to $FF_{255}$, thus holding the data in the flip-flops. The column decoder 25 receives the column address signal of $CA_0$ to $CA_7$, independently from the application of it to the column decoder 5 and outputs a column decoded signal $CDB_j$ defined by the received column address signal of $CA_0$ to $CA_7$ to the corresponding shift register $SR_j$. The column decoded signal $CDB_j$ indicates a first location of data read from the flip-flops. Upon receipt of the column decoded signal $CDB_j$, the j-th shift register $SR_j$ energizes a j-th serial gate $SG_j$ to turn the gate ON, outputting data stored in j-th flip-flop $FF_j$ to the serial data bus 2. The data on the serial data bus 20 is amplified at the amplifier circuit 26 and output as an output data $SS_{OUT}$ to another port through the I/O circuit 27. As a clock signal is supplied to the shift register group 24, data of "1" in the j-th shift register $SR_j$ is transferred to the (j+1)-th shift register $SR_{j+1}$, outputting the next data stored n the (j+1)-th flip-flop $FF_{j+1}$ to another port. Similar operation may follow consecutively, serially outputting up to 256 data bits stored in the flip-flops $FF_0$ to $FF_{255}$ to another port without further transferring data from the dynamic RAM cell array 1. Accordingly, a large amount of data can be easily and rapidly output. A large data store may be also effected in a way similar to that set forth above.

Provision of the above serial data I/O portion 200 enables high-speed data input and output in addition to a normal random access operation in the dynamic RAM portion 100. This, however, increases the complexity of the circuit and thus reduces the integration of the circuit in a chip. It also results in high power consumption in the chip. These disadvantages are serious ones in semiconductor memory devices, especially dynamic RAM devices.

In particular, the dynamic RAM device shown in FIG. 1 is provided with two independent column decoders 5 and 25, one column decoder 5 activating the gate groups 3 and 4 and another column decoder 25 designating a start location for serial data input and output. FIG. 2 is a circuit diagram of a part of the column decoder 5. In FIG. 2, i- and j-th column decoding circuits are shown. A plurality of pairs of column address signal lines $A_0$ and $\overline{A_0}$ to $A_7$ and $\overline{A_7}$ extend in parallel in the column decoder 5. With respect to the i-th column decoding circuit, eight transistors $Q_1$ to $Q_8$ are provided between lines $L_1$ and $L_2$. Gates thereof are connected to one side of the plurality of pairs of column address signal lines so that an i-th column decoded signal $CDA_i$ is output when the plurality of pairs of column address signal $A_0$ and $\overline{A_0}$ to $A_7$ and $\overline{A_7}$ indicate the number "i". In the column decoder 5, 256 column decoding circuits, each of which is formed similar to the i- or j-th column decoding circuit shown in FIG. 2, are provided.

Another column decoder 25 is also provided with 256 column decoding circuits, each of which is formed similar to that in the column decoder 5.

Figure 3A:
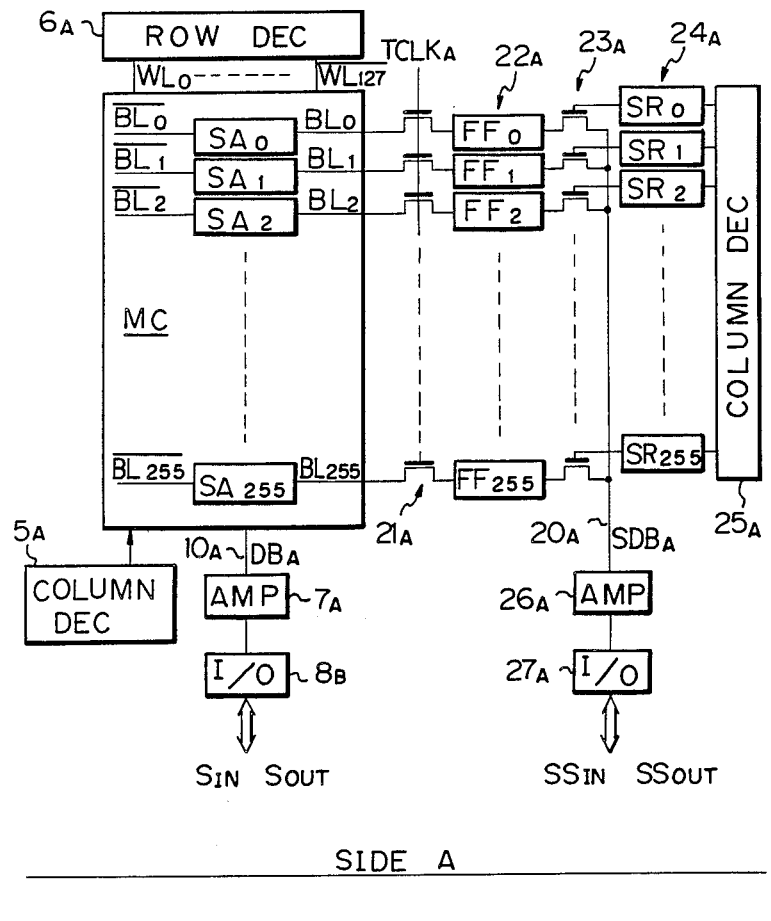
FIG. 3, including 3a and 3b, is a circuit diagram of another prior art semiconductor memory device including two memory systems, each having a high-speed serial input and output circuit.
Figure 3B:
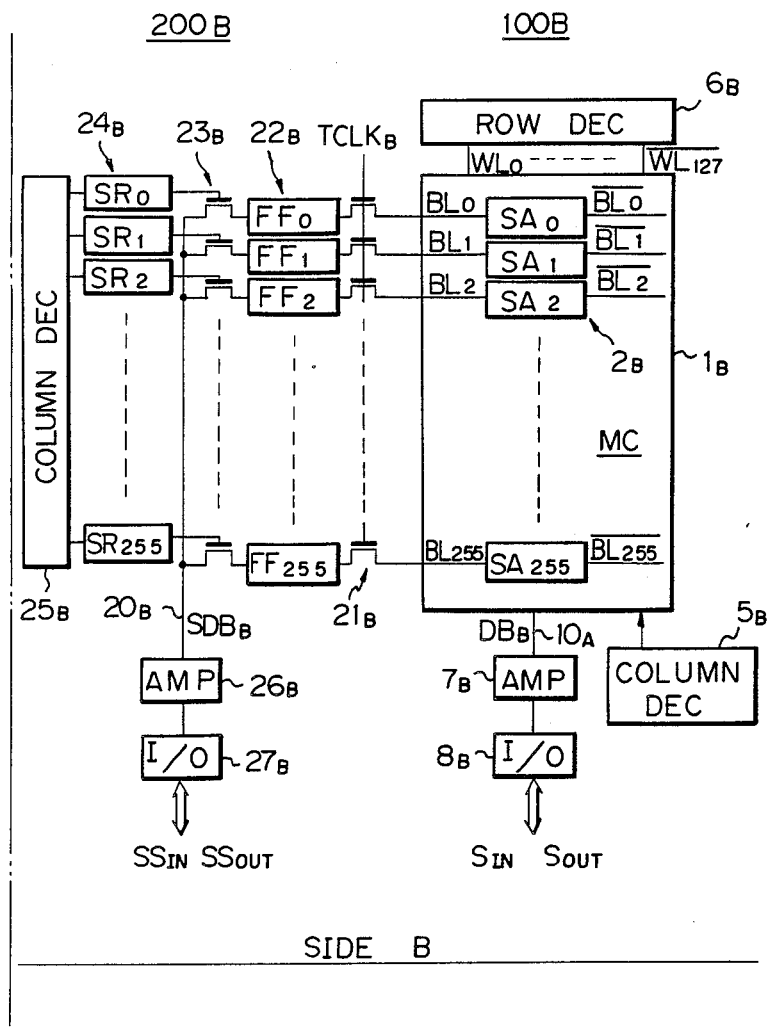

Referring to FIG. 3, two dynamic RAM devices are formed in a chip. Each dynamic RAM device includes a dynamic RAM portion 100A, 100B and a serial data I/O portion 200A, 200B. Each dynamic RAM device has the same circuit construction as that shown in FIG. 1. The dynamic RAM devices are operable independently from each other. In FIG. 3, four column decoders 5A, 5B, 25A, and 25B are provided. The column decoders 5A and 5B activate gates for data buses, while the column decoders 25A and 25B designate state locations of serial data input and output. Each column decoder is naturally formed similar to that shown in FIG. 2.

Referring back to FIG. 1, note that the two column decoders 5 and 25 never operate at the same time. The column decoder 5 may operate in a random data access mode. The column decoder 25 may operate in a serial data input and output operation mode and in a short period for designating the first data input and output location to the corresponding shift register. This allows the deletion of the column decoder 25 and common use of the column decoder 5 for the random data access as well as the serial data input and output. In addition, the common use of the column decoder 5 will cause no conflict between the random access means and the serial access means as long as only a single set of column address receiving circuitry is provided in the semiconductor memory device since only one column address can be applied to the semiconductor memory device at a time regardless of the access mode. This concept can also be applied to the dynamic RAM devices shown in FIG. 3.

Preferred embodiments of the present invention will now be described in detail.

Figure 4B:
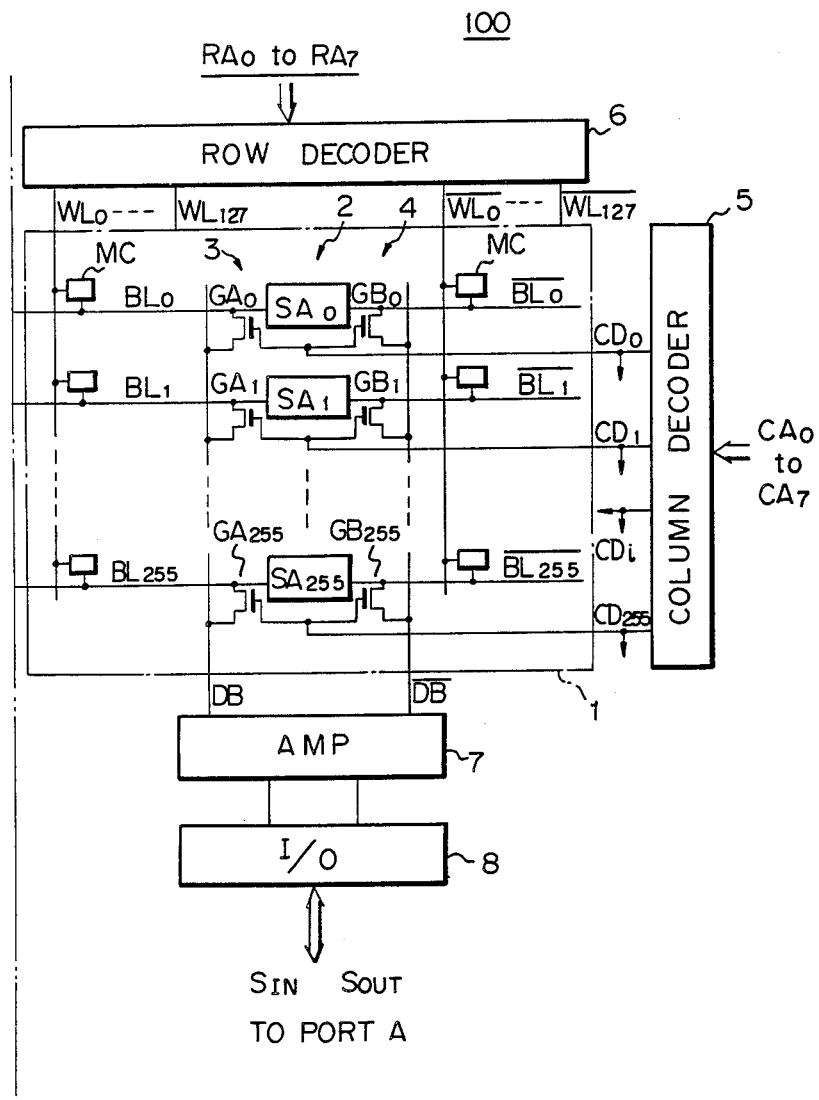
FIG. 4, including 4a and 4b, is a circuit diagram of an embodiment of a semiconductor memory device having a high-speed serial input and output circuit in accordance with the present invention.

Referring to FIG. 4, a circuit diagram of an embodiment of a semiconductor memory device is shown. The semiconductor memory device in FIG. 4 is of an open-bit line type dynamic RAM device as shown in FIG. 1. The dynamic RAM device in FIG. 4 includes a dynamic RAM portion 100 and a serial data I/O portion 200'. The dynamic RAM portion 100 is identical to that shown in FIG. 1. On the other hand, the serial data I/O portion 200' does not include the column decoder 25 shown in FIG. 1. The shift register group 24 receives column decoded signals $CD_0$ to $CD_{255}$ from the column decoder 5 instead of the column decoder 25.

The decoding circuit shown in FIG. 2 is still used for the column decoder 5 in FIG. 4. The operation of the i-th column decoding circuit will be described. In an initial condition, a reset pulse R is supplied to gates of MOS transistors $Q_{12}$ and $Q_{13}$, resulting in the column decoded signal $CD_i$ being the low level of the ground level $V_{SS}$ and the potential of the line $L_1$ being pulled-up to the high level $V_{CC}$. When the column address signal $A_0, \overline{A_0}$ to $A_7, \overline{A_7}$ does not coincide with the number "i", at least one of the MOS transistors $Q_1$ to $Q_8$ is turned ON, thus a short-circuit is created between the lines $L_1$ and $L_2$, whereupon a column decoded signal $CD_i$ of a low level is output, unless a column decoder selection signal CDS of high level is supplied to a source of MOS transistors $Q_{10}$. On the other hand, when the column address signal indicates the number "i", all transistors $Q_1$ to $Q_8$ are turned OFF, thus the line $L_1$ is kept at the high level. This high voltage is supplied to a gate of the transistor $Q_{10}$ through a MOS transistor $Q_{11}$. Accordingly, upon receipt of the column decoder selection signal CDS of the high level, a column decoded signal $CD_i$ of the high level is output. In this case, other column decoded signals $CD_0$ to $CD_{i-1}$ and $CD_{i+1}$ to $CD_{255}$ are naturally the low level. As can be seen from the description, the column decoding circuit is formed as a NOR gate circuit. Referring back to FIG. 4, the selected column decoded signal $CD_i$ is used for gating i-th gates $GA_i$ and $GB_i$ in the gate groups 3 and 4 in the random access operation mode or for loading into the i-th shift register $SR_i$ in the serial data input and output operation mode.

Figure 5:
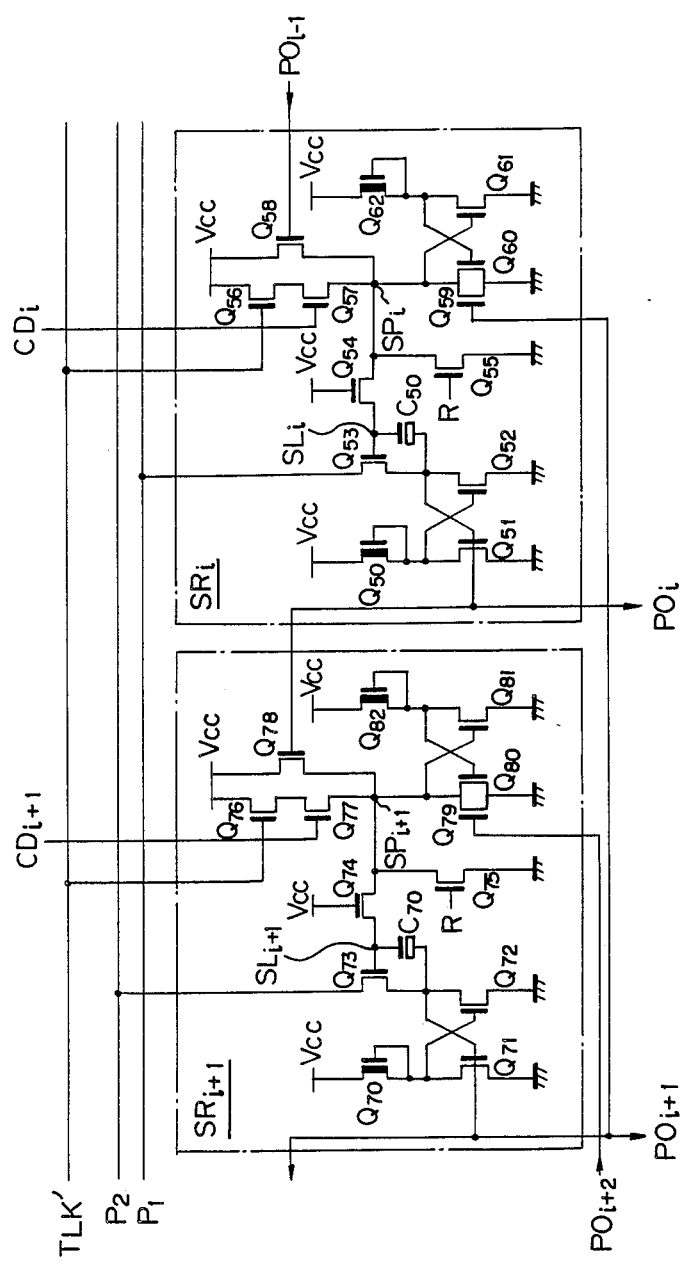
FIG. 5 is a circuit diagram of a part of a serial register array shown in FIG. 4.

Referring to FIG. 5, the circuit of the i-th and (i+1)-th shift registers $SR_i$ and $SR_{i+1}$ is shown. The i-th shift register $SR_i$ includes a depletion (D)-type transistor $Q_{50}$, a pair of enhancement (E)-type transistors $Q_{51}$ and $Q_{52}$ forming a flip-flop, E-type transistors $Q_{53}$ to $Q_{55}$, series-connected E-type transistors $Q_{56}$ and $Q_{57}$, an E-type transistor $Q_{58}$, an E-type transistor $Q_{59}$, a pair of E-type transistors $Q_{60}$ and $Q_{61}$ forming a flip-flop, a D-type transistor $Q_{62}$, and a capacitor $C_{50}$ of a depletion layer of a transistor. A source of the transistor $Q_{53}$ is supplied with a first clock pulse $P_1$ for driving shift registers. A gate of the transistor $Q_{56}$ is supplied with a transfer clock signal TLK' which is the high level in the serial data input and output operation mode and allows loading of one bit into a shift register in response to the column decoded signal. A gate of the transistor $Q_{57}$ receives the i-th column decoded signal $CD_i$. The (i+1)-th shift register $SR_{i+1}$ has a similar circuit construction to that of the shift register $SR_i$. However, a transistor $Q_{73}$ receives a second clock pulse $P_2$ for driving shift registers. The D-type transistor $Q_{50}, Q_{62}, Q_{70}$, and $Q_{82}$ can be replaced with resistors.

Figure 6A:
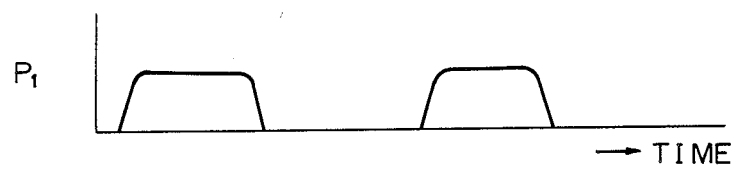
FIGS. 6a and 6b are views of waveforms of clock pulses applied to the serial register array shown in FIG. 5.
Figure 6B:
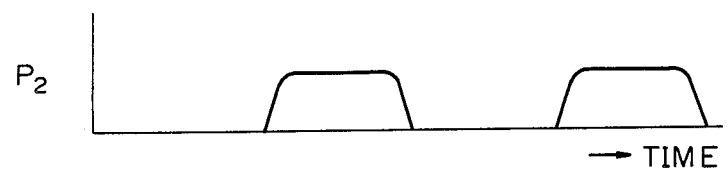

The operation of the shift registers shown in FIG. 5 will be described with reference to FIGS. 6a and 6b. FIGS. 6a and 6b are views of waveforms of the first and second clock pulses $P_1$ and $P_2$ for driving the shift registers. The clock pulses $P_1$ and $P_2$ differ in phase by 180°.

In an initial condition, the reset pulse R is supplied to gates of transistors $Q_{55}$ and $Q_{75}$, resulting in voltage levels at nodes $SP_i$ and $SL_i$ in the register $SR_i$ and $SP_{i+1}$ and $SL_{i+1}$ in the register $SR_{i+1}$ being at the low level, the flip-flops formed by the pairs of transistors $Q_{51}, Q_{52}$; $Q_{60}, Q_{61}$; $Q_{71}, Q_{72}$; and $Q_{80}, Q_{81}$ being reset, and thus pointer outputs $PO_i$ and $PO_{i+1}$, connected to gates of i-th and (i+1)-th serial gates $SG_i$ and $SG_{i+1}$ in the serial data gate group 23, being the low level. When a column decoded signal $CD_i$ of the high level is supplied to the gate of the transistor $Q_{57}$ and the clock pulse TLK' is supplied to the gate of the transistor $Q_{56}$, the node $SP_i$ is charged up, rendering the flip-flop of the transistors $Q_{60}$ and $Q_{61}$ in the SET state and charging the node $SL_i$ up to the high level. Due to the application of the first clock pulse $P_l$ to the source of the transistor $Q_{53}$, the flip-flop of the transistors $Q_{51}$ and $Q_{52}$ is set and thus the i-th pointer output $PO_i$ of the high level is output. Due to the application of the pointer output $PO_i$ of the high level to the i-th gate $SG_i$, the content previously stored in the i-th flip-flop $FF_i$ in the flip-flop group 22 is transferred to the serial data bus 20, outputting the data on the serial data bus 20 to another port through the amplifier circuit 26 and the I/O circuit 27. Simultaneously, the i-th pointer output $PO_i$ is supplied to a gate of the transistor $Q_{78}$ parallel-connected to a series circuit of the transistors $Q_{76}$ and $Q_{77}$, in the adjoining shift register $SR_{i+1}$, charging the nodes $SP_{i+l}$ and $SL_{i+l}$ up at the high level and rendering the flip-flop of the transistors $Q_{80}$ and $Q_{81}$ in the SET state. Due to the application of the second clock $P_2$ to the transistor $Q_{73}$, the flip-flop of the transistors $Q_{71}$ and $Q_{72}$ is set, outputting the (i+1)-th pointer output $PO_{i+1}$ of the high level to the (i+1)-th gate $SG_{i+1}$. At this time, the (i+1)-th pointer command $PO_{i+1}$ is supplied to a gate of the transistor $Q_{59}$ forming a reset gate of the flip-flop of the transistors $Q_{60}$ and $Q_{61}$. The flip-flop of the transistors $Q_{60}$ and $Q_{61}$ as well as the flip-flop of the transistors $Q_{51}$ and $Q_{52}$ in the preceding step of the shift register $SR_i$ are reset. As a result, the i-th pointer output $PO_i$ is restored to the low level. This means that the logical "1" data stored in the shift register $SR_i$ is shifted to the following shift register $SR_{i+1}$. In this case, the (i+1)-th data stored in the (i+1)-th flip-flop $FF_{i+1}$ is output to another port in the same way as described above. When the first clock $P_1$ is supplied to the (i+2)-th shift register $SR_{i+2}$, the (i+2)-th pointer output $PO_{i+2}$ of the high level is output and the (i+1)-th pointer output $P_{i+1}$ becomes the low level. The above operation is continued for a desired number of times for serially outputting desired data.

Figure 7:
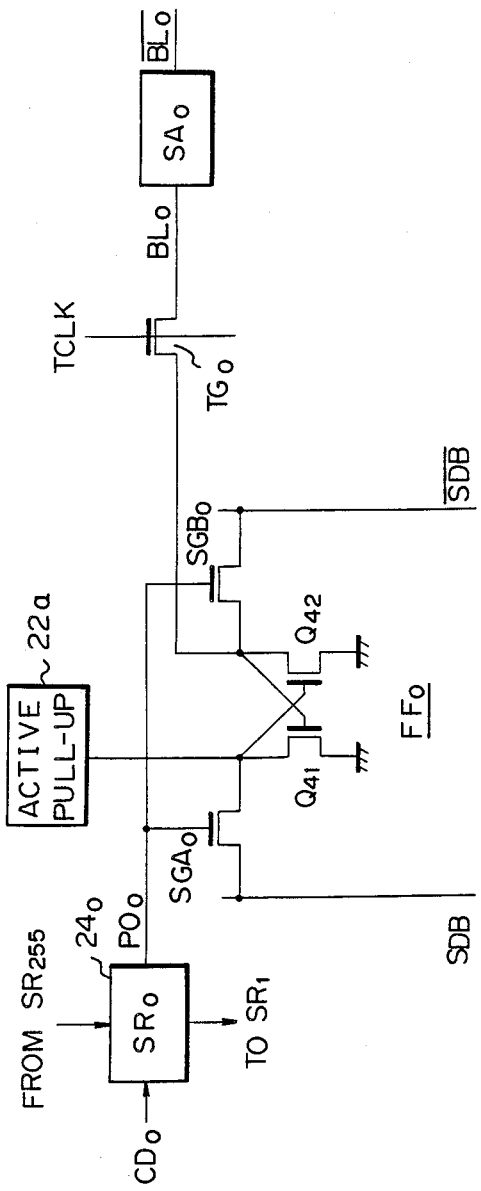
FIG. 7 is a circuit diagram of sense amplifiers, transfer gates, serial transfer gates, flips-flops, and shift registers shown in FIG. 4.

Referring to FIG. 7, the circuit of the o-th flip-flop $FF_o$ and the connection between the flip-flop $FF_o$ and the relevant circuits, i.e., the serial data gates $SGA_0$ and $SGB_0$, the transfer gate $TG_0$, the sense amplifier $SA_0$, and the serial data buses SDB and $\overline{SDB}$, are shown. The flip-flop $FF_o$ consists of MOS transistors $Q_{41}$ and $Q_{42}$ and is connected to an active pull-up circuit 22a. In FIG. 4, the serial data bus (SDB) 20 is shown as a single data bus. In FIG. 7, however, complementary-type data buses SDB and $\overline{SDB}$, which may increase the reliability of sensing data, are shown. Accordingly, a pair of serial data gates $SGA_0$ and $SGB_0$ connecting the flip-flop $FF_o$ to the data buses SDB and $\overline{SDB}$ are provided. The complementary serial data buses SDB and $\overline{SDB}$ can naturally be applied to the circuit shown in FIG. 4.

As can be seen from the description with reference to FIGS. 4 to 7, in spite of the deletion of the column decoder 25 shown in FIG. 1, the dynamic RAM device can effect both the random data access operation and high-speed serial data input and output operation. Due to the deletion of the column decoder 25 and common use of the column decoder 5 for the random data access operation and the designation of the first location to the shift registers in the serial data input and output operation mode, there is achieved a dynamic RAM device with reduced circuit complexity, use of space, and power consumption.

The circuits of the shift registers and the flip-flops FF are simple. This may increase the above effects.

Figure 8A:
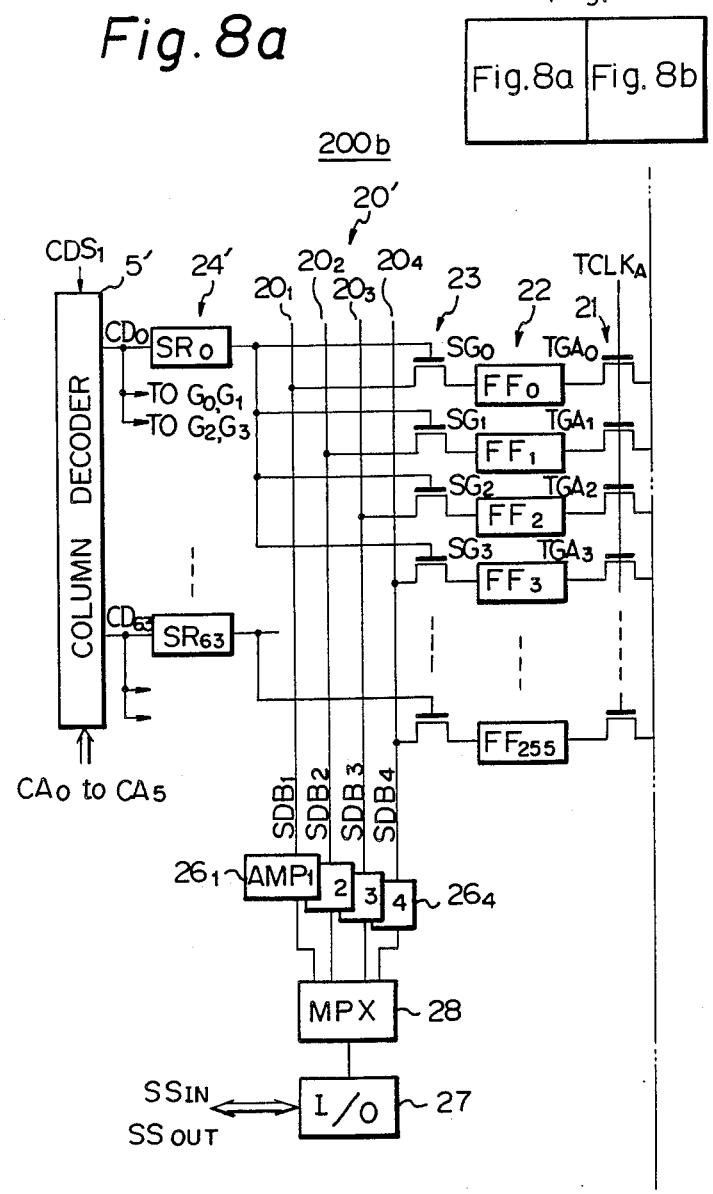
FIG. 8, including 8a and 8b, is a circuit diagram of another embodiment of a semiconductor memory device in accordance with the present invention.
Figure 8B:
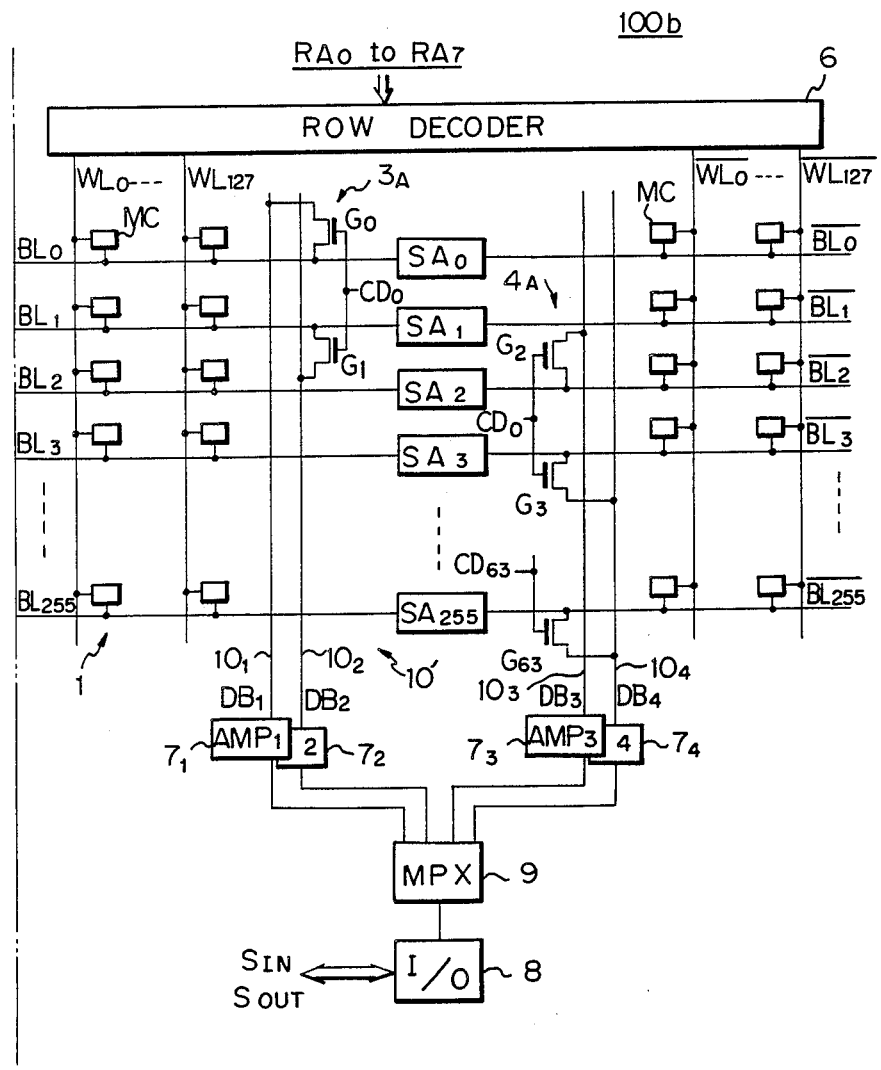

FIG. 8 is a circuit diagram of another embodiment of a semiconductor memory device in accordance with the present invention. The semiconductor memory device is an open-bit line type dual port dynamic RAM device similar to that in FIG. 4. The dynamic RAM device in question, however, includes four data buses (DB1 to DB4) $10_1$ to $10_4$, four amplifier circuits $7_1$ to $7_4$, and a multiplexer 9 in a dynamic RAM portion 100b. The dynamic RAM device also includes four serial data buses (SDB1 to SDB4) $20_1$ to $20_4$, four amplifier circuits $26_1$ to $26_4$, and a multiplexer 28 in a serial data I/O portion 200b. The addition of the data buses $10_1$ to $10_4$ and the serial data buses $20_1$ to $20_4$ greatly improves the access time of the dynamic RAM cell. The multiplexer 9 performs the multiplexing of data from and to the amplifier circuits $7_1$ to $7_4$ in a predetermined time interval during the random access mode. The multiplexer 28 performs the multiplexing of data from and to the amplifier circuits $26_1$ to $26_4$ in a predetermined time interval during the serial data input and output mode.

Figure 9:
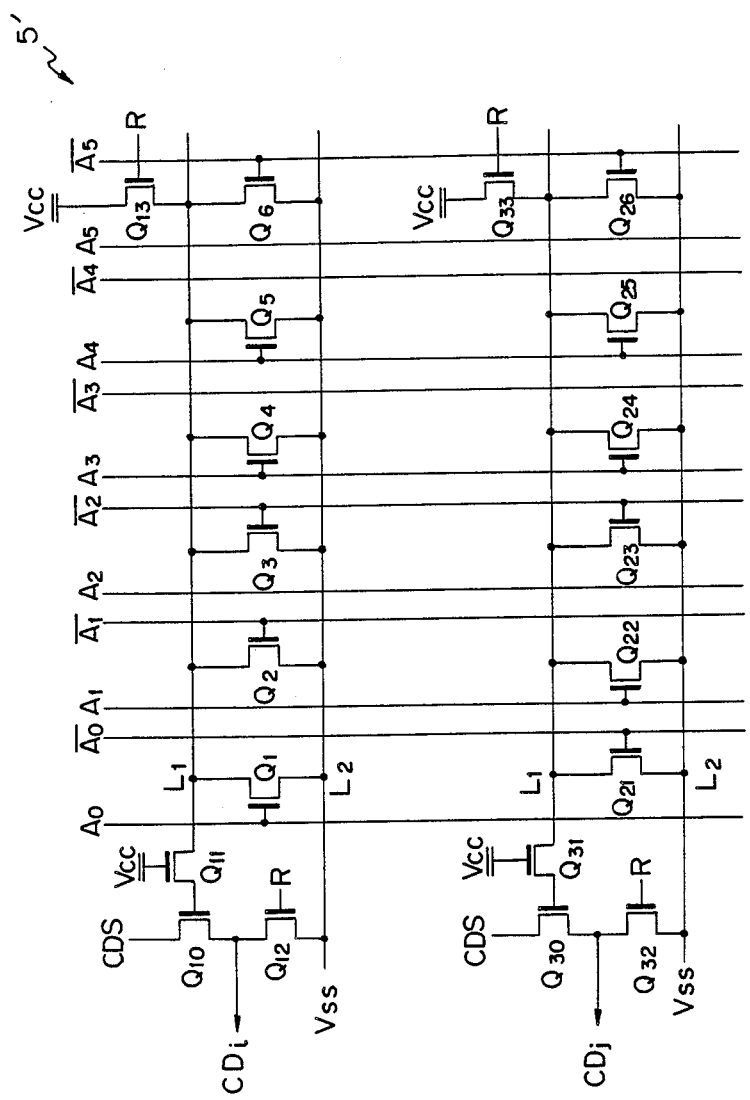
FIG. 9 is a circuit diagram of an example of a part of a column decoder shown in FIG. 8.

Due to the addition of the data buses, the circuit connection of first and second gate groups 3A and 4A is somewhat changed from that in FIG. 4. The connection of the serial data gate group 23 to the serial data buses $20_1$ to $20_4$ is also changed. Four gates, such as $G_0$ and $G_1$ in the first gate group 3A and $G_2$ and $G_3$ in the second gate group 4A, may be triggered in a group by one column decoded signal, such as $CD_0$. Similarly, four serial gates, such as $SG_0$ to $SG_3$ in the serial data gate group 23, may be triggered in a group. Accordingly, a column decoder 5' does not require the column address signal of $A_6$, $\overline{A_6}$ and $A_7$, $\overline{A_7}$, thus is simplified as shown in FIG. 9. A shift register group 24' has, accordingly, only 64 shift registers $SR_0$ to $SR_{63}$.

The principle of the operation of the dynamic RAM device shown in FIG. 8 is the same as that of the dynamic RAM device shown in FIG. 4, thus a description thereof is omitted.

Figure 10:
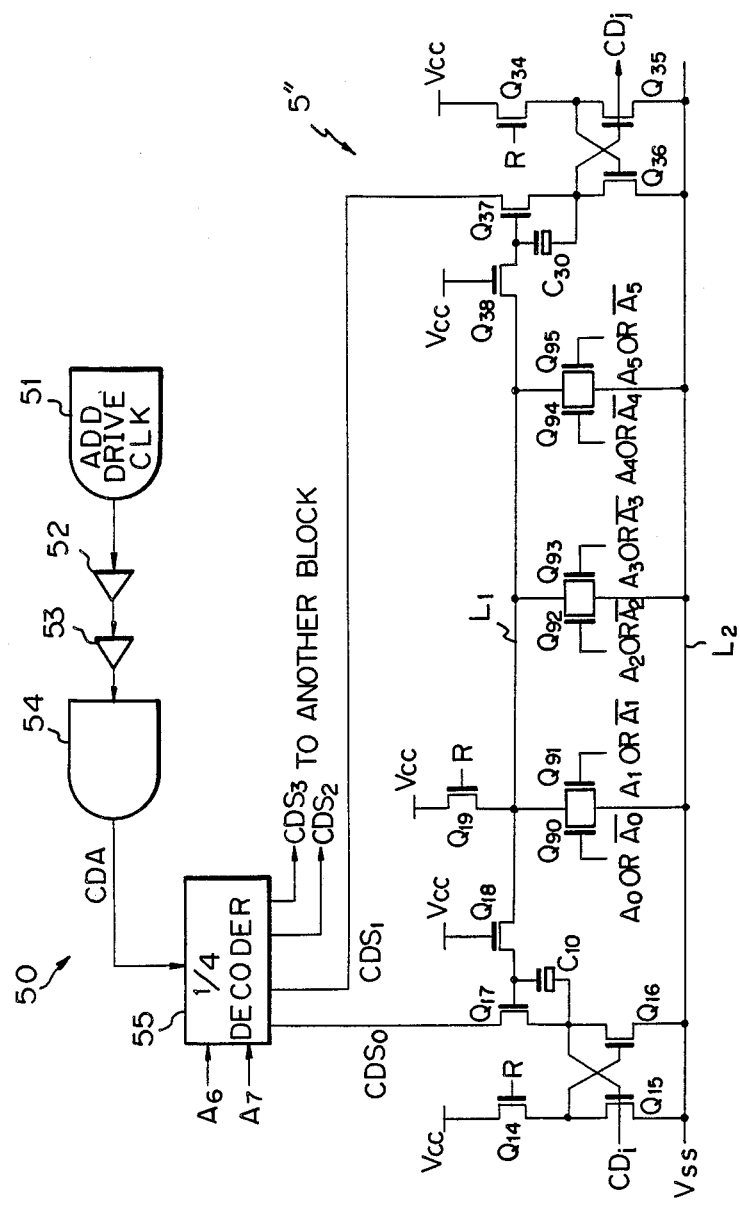
FIG. 10 is a circuit diagram of another example of a part of a column decoder and a circuit relevant to the column decoder shown in FIG. 8.

Referring to FIG. 10, a circuit diagram of another example showing a part of a column decoder 5" corresponding to that in FIG. 9 and a predecoder circuit 50 are shown. The predecoder circuit 50 includes an address drive clock circuit 51, tandem-connected gates 52 and 53 for shifting the level of a signal output from the circuit 51, a column decoder activating circuit 54 generating the column decoder activation signal CDA, and a ¼ decoder 55. The ¼ decoder 55 receives the column address signal $A_6$ and $A_7$ and the column decoder activation signal CDA and outputs column decoder selection signals $CDS_0$ to $CDS_3$. In the column decoder 5", MOS transistors $Q_{90}$ to $Q_{95}$ the connection of which is represented by a general form, correspond to, for example, transistors $Q_1$ to $Q_6$ shown in FIG. 9. In order to improve the operational reliability, a flip-flop circuit of MOS transistors $Q_{15}$ and $Q_{16}$ and a capacitor $C_{10}$ are provided. Another flip-flop circuit of MOS transistors $Q_{35}$ and $Q_{36}$ and a capacitor $C_{30}$ are also provided. Other transistors $Q_{14}$, $Q_{17}$, $Q_{18}$, and $Q_{19}$ correspond to the transistors $Q_{12}$, $Q_{10}$, $Q_{11}$, and $Q_{13}$ shown in FIG. 9, respectively.

Figure 11A:
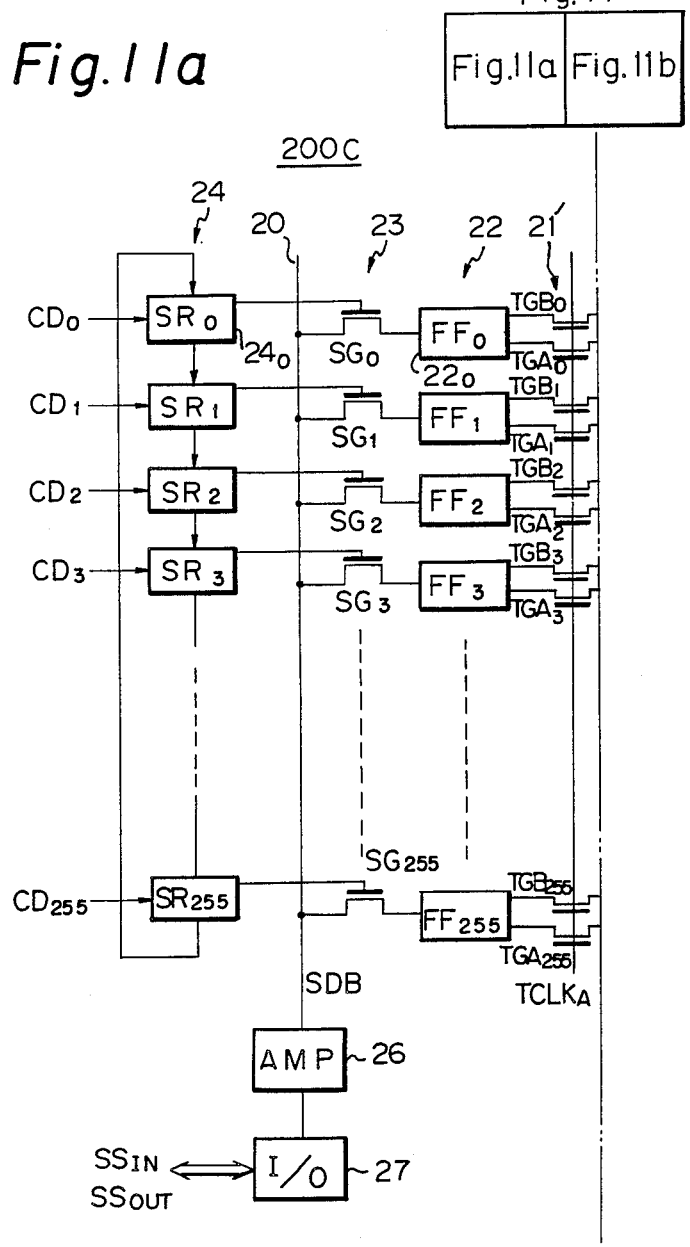
FIG. 11, including 11a and 11b, is a circuit diagram of still another embodiment of a semiconductor memory device in accordance with the present invention.
Figure 11B:
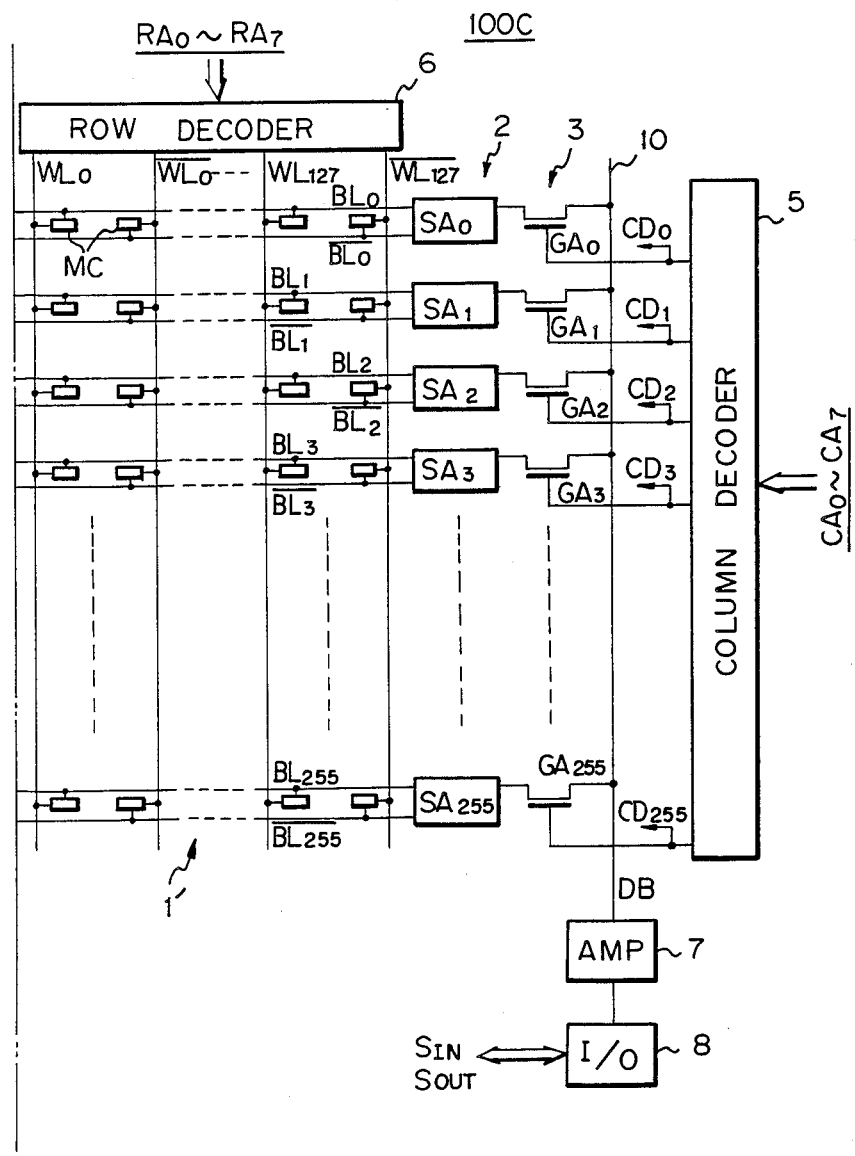
Figure 12:
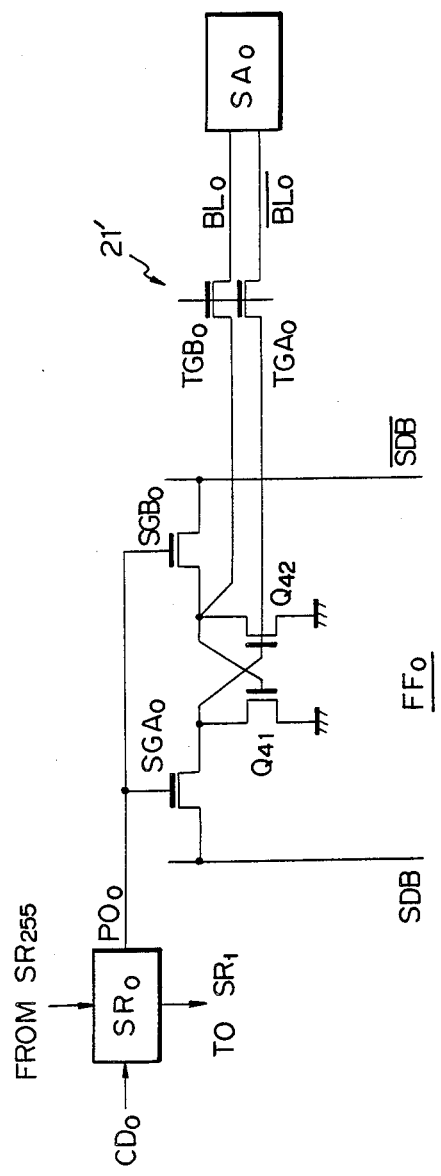
FIG. 12 is a circuit diagram of sense amplifiers, transfer gates, serial transfer gates, flip-flops, and shift registers shown in FIG. 11.

Referring to FIG. 11, a folded-bit line type dual port dynamic RAM device is shown. Each pair of bit lines, such as $BL_0$ and $BL_0$, are folded at the sense amplifier $SA_0$. This type of bit line arrangement may increase the resistance to noise. The dynamic RAM device includes a dynamic RAM portion 100C and a serial data I/O portion 200C. Referring to FIG. 12, a part of the circuit shown in FIG. 11 is shown in detail, the circuit of FIG. 12 corresponds to that of FIG. 7. The transfer gate group 21' in FIG. 11 consists of 256 pairs of transfer gates, each pair of gates, such as $TGA_0$ and $TGB_0$, being provided between the sense amplifier $SA_0$ and the flip-flop $FF_0$ and connected to the pair of bit lines $BL_0$ and $\overline{BL_0}$. A column decoder 5 activates either a gate group 3 connected between a sense amplifier group 2 and a data bus 10 in the dynamic RAM portion 100C or a shift register group 24 in the serial data input and output portion 200C, in response to the random access mode or the serial data input and output mode. Other circuit constructions and operations are similar to those of FIG. 4.

Figure 13B:
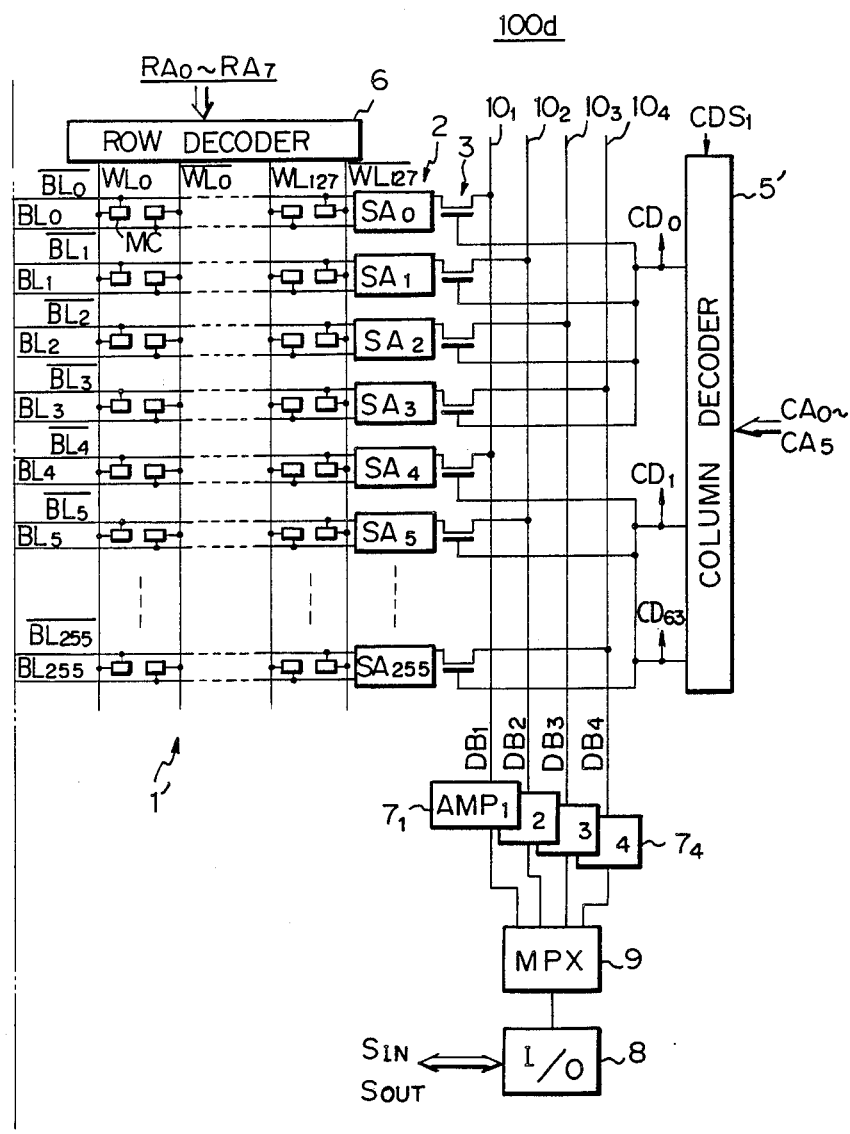
FIG. 13, including 13a and 13b, is a circuit diagram of yet another embodiment of a semiconductor memory device in accordance with the present invention.

Referring to FIG. 13, another folded-bit type dual port dynamic RAM device is shown. The dynamic RAM device includes four data buses $10_1$ to $10_4$ and four serial data buses $20_1$ to $20_4$, as shown in FIG. 8. Accordingly, the circuit construction and operation of FIG. 8 can be applied to the dynamic RAM device in FIG. 13 in the same way, except for the connection between the bit lines and the transfer gates, shown in FIG. 12.

Figure 14A:
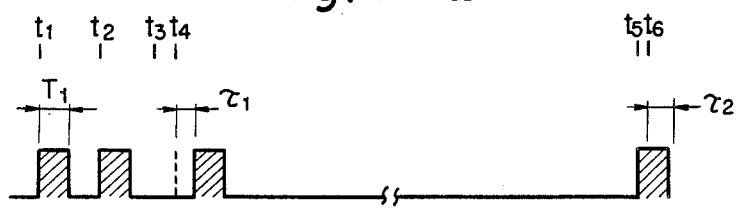
FIGS. 14a and 14b are timing charts illustrating the operation of a column decoder shown in FIG. 13.
Figure 14B:
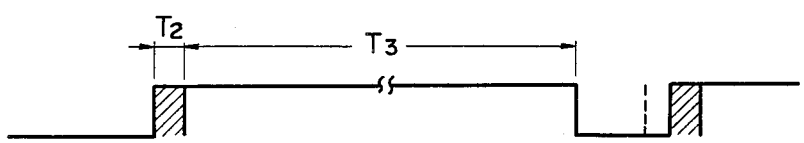

Referring to FIGS. 14a and 14b, the operation timing of the common column decoder 5' in the FIG. 13 will be described. In FIGS. 14a and 14b, shaded portions represent operation times of the column decoder 5'. FIG. 14a represents operation times for the random access in a dynamic RAM portion 100d. Each operation time for random access is $T_1$. FIG. 14b represents operation times for the serial data input and output. Each operation time of the column decoder for the serial data input and output is $T_2$. The subsequent operation time $T_3$, not the shaded portion, shows an operation for serial data input and output after once storing 256 data fits from the dynamic RAM cell portion 1' into 256 flip-flops $FF_0$ to $FF_{255}$.

The dynamic RAM cell portion 1' includes 64K bits of memory cells. Assuming the random access for four data bits in parallel, requires 250 nanoseconds (ns), the above time $T_1$ is 250 ns. Assuming also the time for selecting one pair of word lines $WL_i$ and $\overline{W_i}$ and transferring 256 data on the bit lines $BL_0$, $\overline{BL_0}$ to $BL_{255}$, $\overline{BL_{255}}$ to the flip-flops $FF_0$ to $FF_{255}$ requires 250 ns, the time $T_2$ is also 250 ns. Furthermore, assuming the time for serially outputting 256 data bits stored in the flip-flops to another port through amplifer circuits $26_1$ to $26_4$, a multiplexer 28, and an I/O circuit 27 requires $40\ ns \times 256$, i.e., 10.24 microseconds (µs), the timer $T_3$ is 10.24 µs. When random accesses are requested at the times $t_1$ and $t_2$, the column decoder 5' operates for the time $T_1$ for each request. When a serial data input and output is requested at the time $t_3$, the column decoder 5' operates for the time $T_2$, equal to the time $T_1$. The subsequent serial data transfer in the serial data input and output portion 200d is effected over a considerably long time $T_3$. Note that during the time $T_3$, the column decoder 5' is available for the random access mode operation. Even if use of the column decoder 5' overlapps at the time $t_3$, the random access operation may be delayed by the time $\tau_1$. On the contrary, the serial data input and output operation at the time $t_5$ may be delayed by the time $\tau_2$. However, these time delays $\tau_1$ and $\tau_2$ are less than 250 ns in this example. Consequently, the actual decline in performance during the random access and/or the serial data input and output, even with overlapping of requests, is negligible.

If the multiplexers 9 and 28 are omitted and four input or output operations are effected in parallel, the above times $T_1$, $T_2$, and $T_3$ are shortened.

Figure 15A:
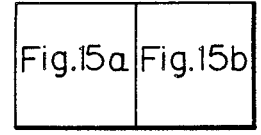
FIG. 15, including 15a and 15b, is a circuit diagram of another embodiment of a semiconductor memory device in accordance with the present invention.
Figure 15A:
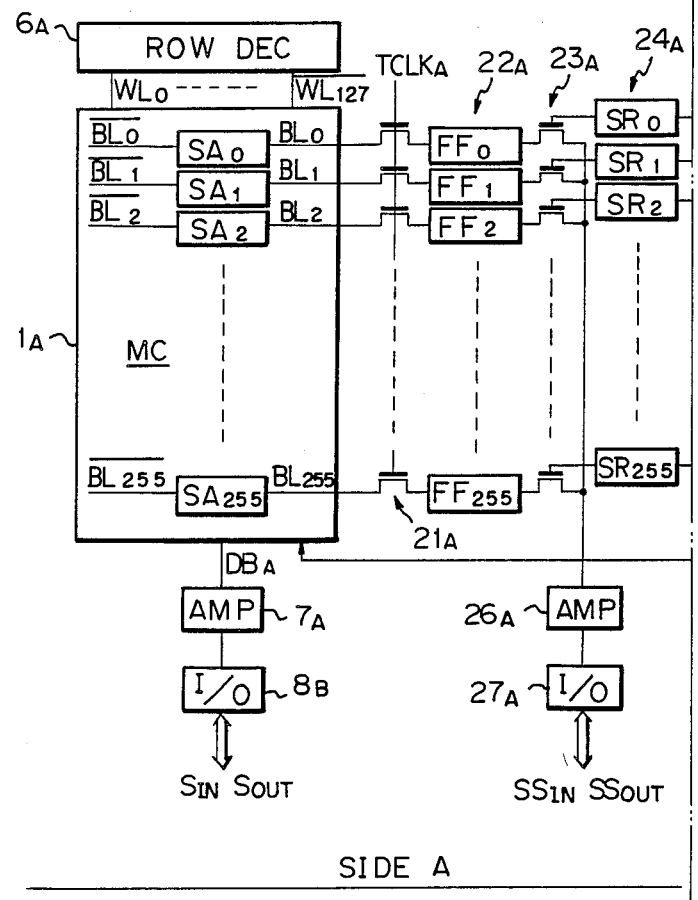
Figure 15B:
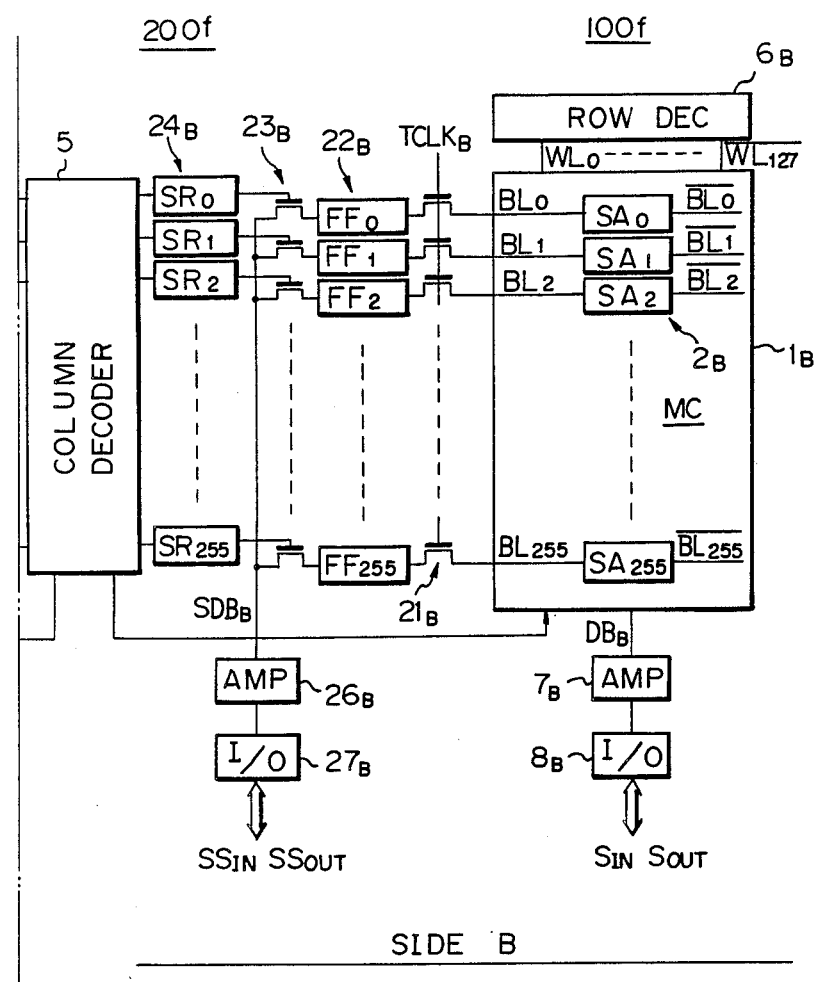

Referring to FIG. 15, a circuit of two dynamic RAM devices on a chip in accordance with the present invention, which is improved over the circuit of the dynamic RAM devices shown in FIG. 3, is shown. Each dynamic RAM device includes a dynamic RAM portion 100e, 100f and a serial data input and output portion 200e, 200f. In FIG. 15, a single column decoder 5 is provided for the two dynamic RAM devices, resulting in a great reduction in space used by the circuit.

Figure 16:
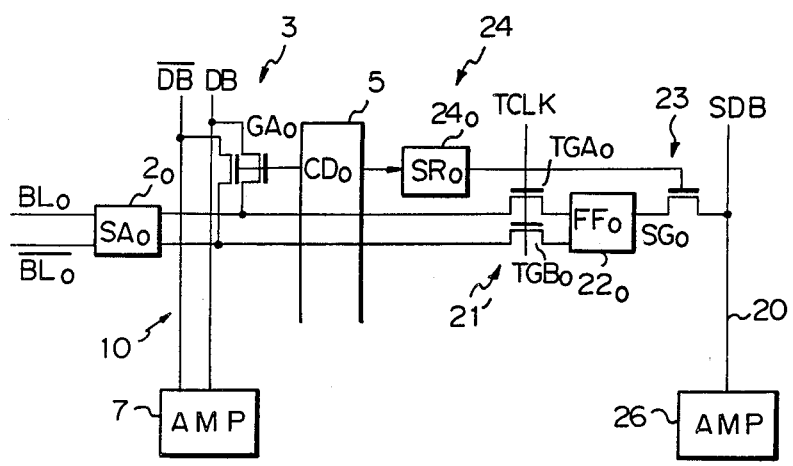
FIG. 16 is a schematic layout of a part of the semiconductor memory device shown in FIG. 11.

In the above description, the circuit configurations and the operations of the embodiments were discussed. In addition, consideration must be given to a circuit arrangement minimizing the lines between the column decoder and the gate group(s) 3 (and 4) connected to the data bus 10, lines between the column decoder and the shift register group 24, lines between the sense amplifier group 2 and the transfer gate group 21, and other lines. FIG. 16 is a part of a schematic layout of an example concerning the circuit shown in FIG. 11. The column decoder 5 is provided between the gate group 3 and the shift register group 24. The serial gate group 23 is provided adjacent to the flip-flop group 24. The many bit lines between the sense amplifier group 2 and the transfer gate group 21' and the lines between the transfer gate group 21' and the flip-flop group 22 should also be minimized in length.

Many widely different embodiments of the present invention may be constructed without departing from the spirit and scope of the present invention. It should be understood that the present invention is not limited to the specific embodiments described in this specification, except as defined in the appended claims.

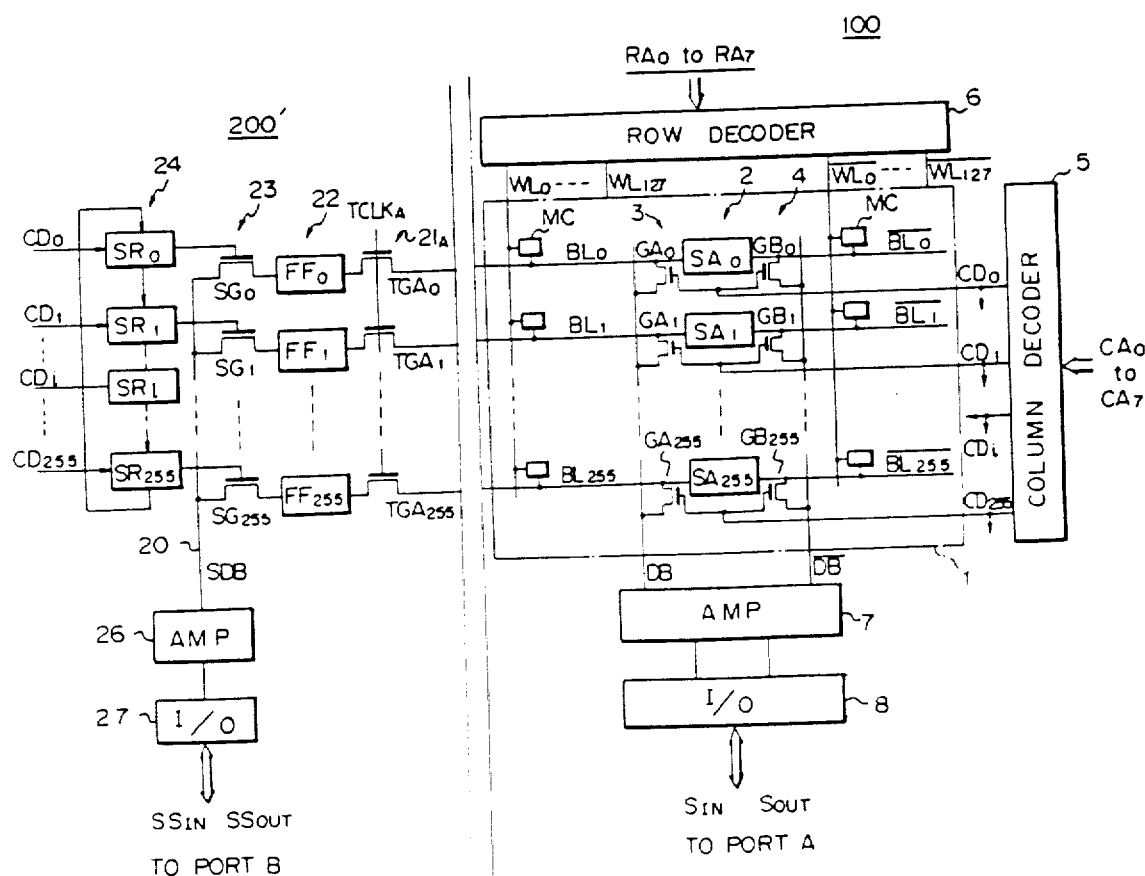

We claim:
1. A semiconductor memory device, comprising:
memory cell array means for storing data and including a plurality of memory cells arranged in a matrix with a plurality of bit lines and a plurality of word lines;
first decoder means, operatively connected to said memory cell array means, for selecting one of said word lines in response to an address signal;
first data bus means for carrying data;
a plurality of first gates, operatively connected between said bit lines and said first data bus means, for transferring data to be stored or read between said bit lines and said first data bus means;
serial data input/output means for serially inputting or outputting data, including:
a plurality of transfer gates, operatively connected to said bit lines and operable in a group in response to a transfer clock pulse;
a plurality of latch circuits operatively connected to said transfer gates and holding data to be stored or read;
serial data bus means for carrying data;
a plurality of serial gates, having terminals operatively connected to said latch circuits and operatively connected to said serial data bus means; and
a plurality of shift registers, connected in cascade to form a ring counter, for triggering said serial gates; and
second decoding means, operatively connected to said first gates, for triggering at least one of said first gates in response to another address signal in a random access operation mode and operatively connected to said shift registers loading decoded data of the column address signal in said shift registers in response to the column address signal in a serial data input and output operation mode;
said serial data input and output means operable independently from said memory cell array means, except during a time for operatively connecting said bit lines and said latch circuits through said transfer gates, for serially inputting data to or outputting data from said latch circuits through said serial data bus means by sequentially triggering said serial gates from one of the gates designated by said corresponding shift register.

2. A semiconductor memory device according to claim 1, wherein said second decoding means is operated only during said time for operatively connecting said bit lines and said latch circuits in said serial data input and output operation mode.

3. A semiconductor memory device according to claim 2, wherein said first data bus means includes one or more first data buses, said serial data bus means includes one or more serial data buses, and the number of said first data bus means being equal to the number of said serial data buses.

4. A semiconductor memory device according to claim 3, wherein said second decoding means includes:
a predecoding circuit outputting a plurality of predecoding signals, defined by a part of said another address signal; and
a plurality of decoders receiving said predecoded signals and including a plurality of decoding circuits, operatively connected to said first gates and said shift registers, defined by the remaining part of said another address signal.

5. A semiconductor memory device according to claim 4, wherein said first gates are operatively connected between said bit lines and said first data bus means so that a plurality of said first gates, defined by said number of said first data buses, are triggered in a group by a signal from said decoding means, to transfer a plurality of data between said first data bus means and said bit lines.

6. A semiconductor memory device according to claim 5, wherein the number of said plurality of shift registers is equal to the number of said plurality of decoding circuits in each decoder,
each shift register triggering a plurality of said serial gates, defined by said number of said serial data buses, in a group, and
wherein said serial gates are operatively connected between said serial data bus means and said latch circuits so that a plurality of data are transferred in parallel between said serial data bus means and said latch circuits.

7. A semiconductor memory device according to claim 6, wherein each of said latch circuits includes a flip-flop.

8. A semiconductor memory device according to claim 6, wherein each of said shift registers is operated in response to the output from said decoding means when a pulse for designating the serial data input and output operation mode is applied to said shift registers.

9. A semiconductor memory device according to claim 8, wherein each of said shift registers is a two-phase ratio-type shift register, a phase clock for shifting one bit in one shift register to an adjacent shift register being applied to the one shift register and another phase clock, shifted approximately 180° phase from said phase clock, being applied to said adjacent shift register.

10. A semiconductor memory device according to claim 3, wherein each first data bus in said first data bus means includes a single bus line.

11. A semiconductor memory device according to claim 3, wherein each first data bus in said first data bus means includes a pair of complementary bus lines.

12. A semiconductor memory device according to claim 3, wherein each serial bus in said serial data bus means includes a single bus line.

13. A semiconductor memory device according to claim 3, wherein each serial bus in said serial data bus means includes a pair of complementary bus lines.

14. A semiconductor memory device according to claim 1, wherein said semiconductor memory device is formed on a chip and conducting lines between said decoding means and said plurality of gates and conducting lines between said decoding means and said shift registers are minimized in length in said semiconductor memory device chip.

15. A semiconductor memory device according to claim 14, wherein conducting lines between said bit lines and said transfer gates and conducting lines between said transfer gates and said latch circuits are minimized in length on said chip.

16. A semiconductor memory device according to claim 1, wherein said memory cell array means includes one or more memory cell arrays, said serial data input and output means includes one or more circuits for serially inputting and outputting data, and the number of said memory cell arrays being equal to the number of said serial input and output circuits.

17. A semiconductor memory device according to claim 16, wherein each memory cell array of said memory cell array means includes dynamic random-access memory (RAM) cells.

18. A semiconductor memory device according to claim 17, wherein said dynamic RAM cells are of an open-bit line form.

19. A semiconductor memory device according to claim 17, wherein said dynamic RAM cells are of a folded-bit line form.

* * * * *

UNITED STATES PATENT AND TRADEMARK OFFICE
CERTIFICATE OF CORRECTION

PATENT NO. : 4,769,789

DATED : September 6, 1988

INVENTOR(S) : Masaaki Noguchi et al.

It is certified that error appears in the above-identified patent and that said Letters Patent is hereby corrected as shown below:

Col. 3, line 27, "$\overline{W}_0$" s/b --$\overline{WL}_0$--.

Col. 4, line 4, "sterial" s/b --serial--;

line 41, "2" s/b --20--;

line 47, "n" s/b --in--;

Col. 9, line 30, "fits" s/b --bits--.

Figure 1B:
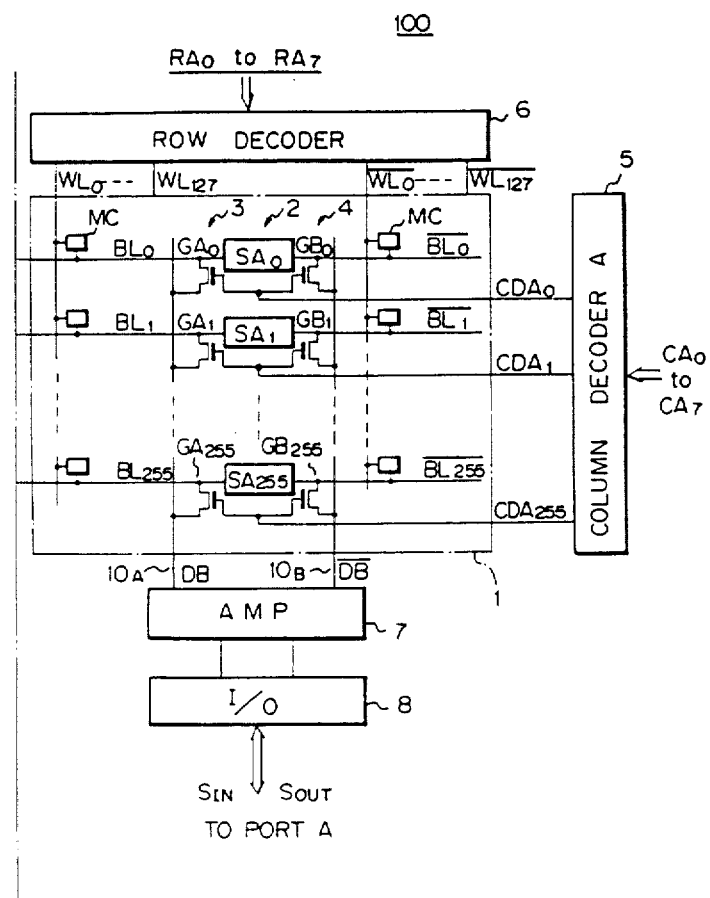
FIG. 1, including 1a and 1b, is a circuit diagram of a prior art semiconductor memory device having a high-speed serial input and output circuit.

Fig. 1b should be added as shown on the attached sheet

The title page showing the illustrative figure should be deleted to appear as per attached page.

Signed and Sealed this

Eighteenth Day of July, 1989

Attest:

DONALD J. QUIGG

Attesting Officer

Commissioner of Patents and Trademarks

United States Patent [19]

Noguchi et al.

[11] Patent Number: 4,769,789
[45] Date of Patent: Sep. 6, 1988

[54] SEMICONDUCTOR MEMORY DEVICE HAVING SERIAL DATA INPUT AND OUTPUT CIRCUIT

[75] Inventors: Masaaki Noguchi, Seto; Junji Ogawa; Yoshihiro Takemae, both of Tokyo, all of Japan

[73] Assignee: Fujitsu Limited, Kawasaki, Japan

[21] Appl. No.: 814,388

[22] Filed: Dec. 30, 1985

[30] Foreign Application Priority Data

Jan. 5, 1985 [JP] Japan ................ 60-000313

[51] Int. Cl.⁴ ........................................ G11C 7/00
[52] U.S. Cl. ................................ 365/189; 365/219
[58] Field of Search .......... 365/189, 73, 230, 219, 365/221

[56] References Cited

U.S. PATENT DOCUMENTS

| 4,222,102 | 9/1980 | Jansen et al. | 365/73 X |
| 4,498,155 | 2/1985 | Mohan Rao | 365/189 |
| 4,586,167 | 4/1986 | Fujishima et al. | 365/189 |

FOREIGN PATENT DOCUMENTS 57-27477 2/1982 Japan .

Primary Examiner—Stuart N. Hecker
Assistant Examiner—Alyssa H. Bowler
Attorney, Agent, or Firm—Staas & Halsey

[57] ABSTRACT

A dual-port type semiconductor memory device having a serial data input and output circuit (200) provided outside of a memory cell array (1) and operable for high-speed serial data input and output of data in addition to random data access. The semiconductor memory device includes a single decoding circuit (5) triggering at least one gate for transferring data to be stored into or read from the memory cell array in a random data access mode and setting a single bit into a corresponding shift register (24) in the serial data input and output circuit in a serial data input and output operation mode. Preferably, the decoding circuit is operated only during a time for operatively connecting bit lines and latch circuits in the serial data input and output circuit in the serial data input and output operation mode. The serial data input and output circuit is operable independently from the memory cell array, except during the time for operatively connecting the bit lines and the latch circuits through transfer gates, for serially inputting data to or outputting data from the latch circuits through serial data bus by sequentially triggering the serial gates from a certain gate designated by the corresponding shift register in response to the decoding circuit.

19 Claims, 21 Drawing Sheets